(12) United States Patent
Okada et al.

(10) Patent No.: US 12,048,157 B2
(45) Date of Patent: Jul. 23, 2024

(54) SEMICONDUCTOR STORAGE DEVICE AND METHOD FOR MANUFACTURING THE SAME

(71) Applicant: Kioxia Corporation, Tokyo (JP)

(72) Inventors: Shunsuke Okada, Suzuka Mie (JP);
Tatsunori Isogai, Yokkaichi Mie (JP);
Masaki Noguchi, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 106 days.

(21) Appl. No.: 17/475,660

(22) Filed: Sep. 15, 2021

(65) Prior Publication Data
US 2022/0302165 A1  Sep. 22, 2022

(30) Foreign Application Priority Data

Mar. 18, 2021 (JP) ................................ 2021-044937

(51) Int. Cl.
| | |
|---|---|
| *H10B 43/27* | (2023.01) |
| *H01L 21/28* | (2006.01) |
| *H01L 29/423* | (2006.01) |
| *H10B 41/27* | (2023.01) |

(52) U.S. Cl.
CPC ........ *H10B 43/27* (2023.02); *H01L 29/40114* (2019.08); *H01L 29/40117* (2019.08); *H01L 29/42324* (2013.01); *H01L 29/4234* (2013.01); *H10B 41/27* (2023.02)

(58) Field of Classification Search
None
See application file for complete search history.

(56) References Cited

U.S. PATENT DOCUMENTS

| | | | |
|---|---|---|---|
| 10,304,853 B2 | 5/2019 | Daycock | |
| 2018/0308991 A1* | 10/2018 | Kadoshima | ......... H01L 29/7923 |
| 2018/0315771 A1 | 11/2018 | Sandhu et al. | |
| 2020/0127002 A1* | 4/2020 | Park | ...................... H10B 43/27 |
| 2021/0296354 A1 | 9/2021 | Uchiyama | |
| 2021/0296458 A1 | 9/2021 | Okada et al. | |

FOREIGN PATENT DOCUMENTS

| | | |
|---|---|---|
| JP | 2021-150499 A | 9/2021 |
| JP | 2021-150525 A | 9/2021 |

* cited by examiner

*Primary Examiner* — Xiaoming Liu
(74) *Attorney, Agent, or Firm* — Foley & Lardner LLP

(57) ABSTRACT

A semiconductor storage device of an embodiment includes: a laminated body including electrode layers and insulating layers alternately stacked in a first direction; a semiconductor layer disposed in the laminated body; a first insulating film disposed between the laminated body and the semiconductor layer; a charge storage film disposed between the laminated body and the first insulating film, thicknesses of the charge storage film in a second direction crossing the first direction in the regions corresponding to the electrode layers being different from that in the regions corresponding to the insulating layers, the charge storage film comprising: a second insulating film disposed between the laminated body and the first insulating film, and a third insulating film disposed between the second insulating film and the regions corresponding to the electrode layers, the third insulating film having a density different from that of the second insulating film.

8 Claims, 12 Drawing Sheets

SEMICONDUCTOR STORAGE DEVICE AND METHOD FOR MANUFACTURING THE SAME

CROSS REFERENCE TO RELATED APPLICATIONS

This application is based upon and claims the benefit of priority from the prior Japanese Patent Application No. 2021-044937, filed on Mar. 18, 2021, the entire contents of which are incorporated herein by reference.

FIELD

Embodiments described herein relate generally to a semiconductor storage device and a method of manufacturing the same.

BACKGROUND

NAND flash memories in which memory cells are three-dimensionally arranged are well known as semiconductor storage devices. Such a NAND flash memory includes a laminated body in which electrode layers and insulating layers are alternately stacked, a memory hole being formed through the laminated body. A memory string including a plurality of series-connected memory cells is formed by providing a charge storage layer and a semiconductor layer in the memory hole. Data is stored in the memory cells by controlling the amount of charge stored in the charge storage layer.

DETAILED DESCRIPTION

Figure 1:
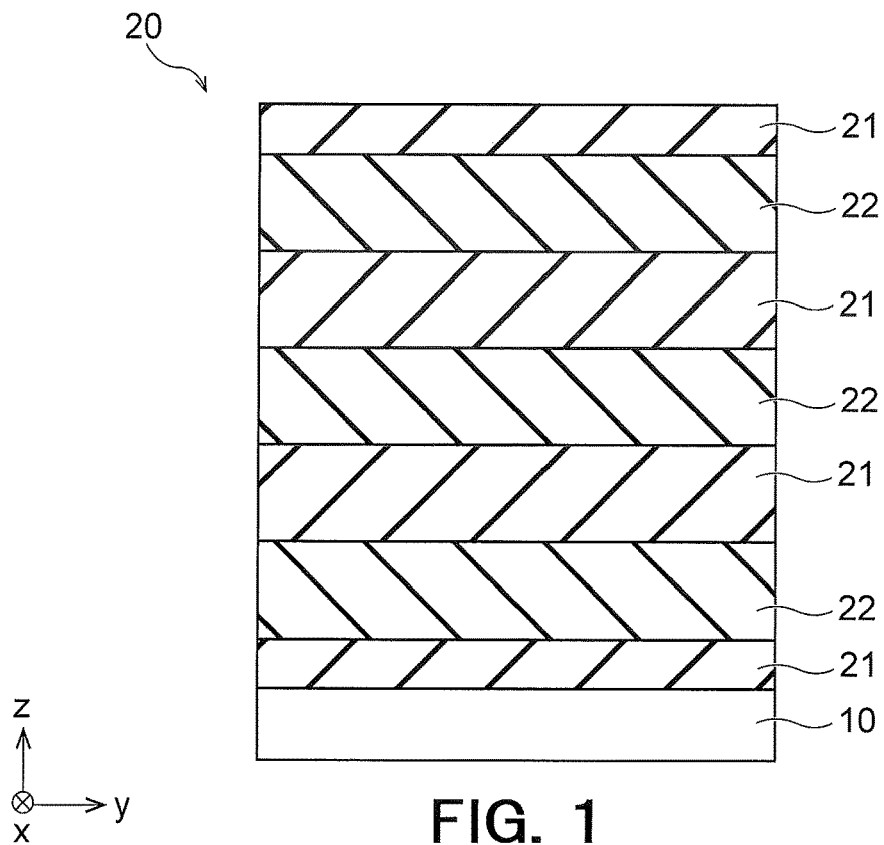
FIGS. 1 to 9 are cross-sectional views illustrating a step of a method of manufacturing a semiconductor storage device according to a first embodiment.

Embodiments of the present invention will now be described with reference to the accompanying drawings. The drawings are made in schematic or conceptional manner, and the relationship between the thickness and the width of each element and the ratio between elements, for example, do not always match those of the actual cases. The dimensions of each element and the ratio between elements may differ in several drawings illustrating the same portion. In the specification and the drawings, the same reference numeral is assigned to the same element, and the detailed description of such an element is repeated only when it is necessarily to do so.

First Embodiment

A semiconductor storage device according to a first embodiment will be described with reference to FIGS. 1 to 13. The semiconductor storage device according to the first embodiment is manufactured in a method described below, for example. First, as shown in FIG. 1, insulating layers 21 and sacrifice layers 22 are alternately deposited on a semiconductor substrate 10. As a result, a laminated body 20 is formed, which include layers stacked in a z direction (the vertical direction in FIG. 1). The insulating layers 21 are silicon oxide layer, for example. The sacrifice layers 22 are silicon nitride layers, for example.

The insulating layers 21 and the sacrifice layers 22 are formed by chemical vapor deposition (CVD), for example. Some of the insulating layers 21 serve as interlayer insulating layers.

Figure 2:
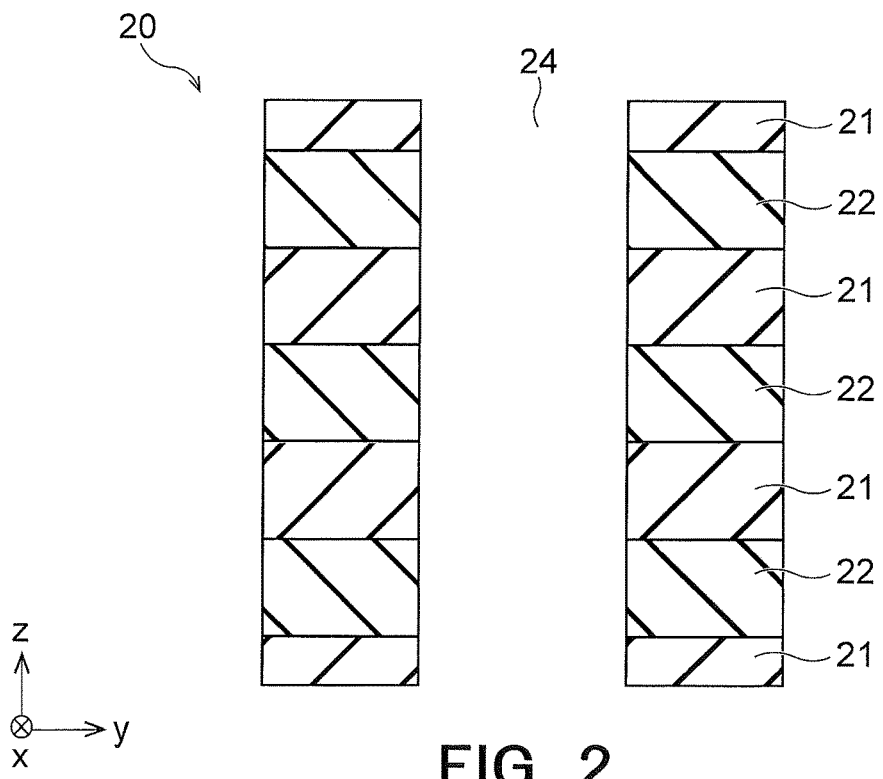

Thereafter, a memory hole 24 is formed in the z direction in the laminated body 20, as shown in FIG. 2. In FIG. 2 and the drawings after FIG. 2, the semiconductor substrate 10 is not shown. The memory hole 24 is formed through the laminated body 20 including the insulating layers 21 and the sacrifice layers 22, by a lithography method and a reactive ion etching (RIE) method, for example.

Figure 3:
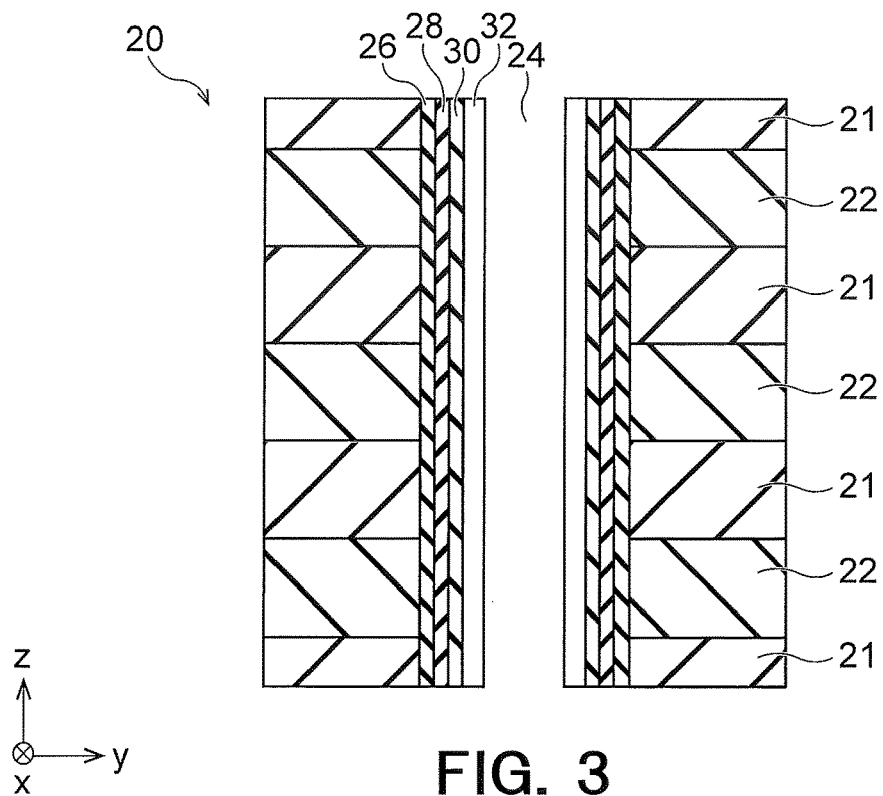

A silicon oxide film 26 having a thickness of 2 nm, for example, is formed as a stopper film inside the memory hole 24 as shown in FIG. 3. A silicon nitride film 28 having a thickness of 2 nm, for example, is formed on the silicon oxide film 26 as a part of a charge storage film. A silicon oxynitride film 30 having a thickness of 5 nm, for example, is formed as a tunnel insulating film on the silicon nitride film 28. A semiconductor layer 32 having a thickness of 7 nm, for example, is formed on the silicon oxynitride film 30. The silicon oxide film 26, the silicon nitride film 28, and the silicon oxynitride film 30 are formed by a CVD method, for example. Typically, polycrystalline silicon is used as the material of the semiconductor layer 32. However, in consideration of the surface roughness, a method in which amorphous silicon is formed at a low temperature (for example, about 500° C.) and crystalized by a heat treatment performed at a temperature of 800° C. or more is employed in this case. The materials of the silicon oxide film 26, the silicon nitride film 28, and the silicon oxynitride film 30 are only described as examples. The materials are not limited as long as the structure of the semiconductor storage device according to the first embodiment, which will be described with reference to FIG. 13, can be made.

Figure 4:
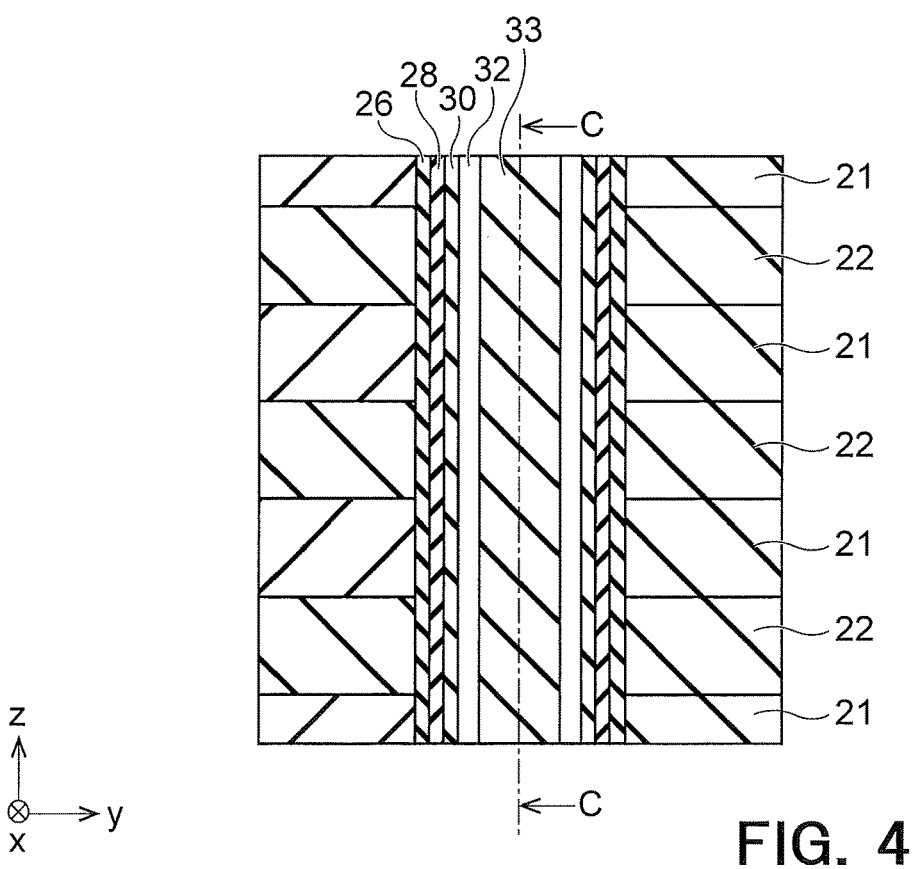

Subsequently, the memory hole 24 is filled with a silicon oxide film 33, as shown in FIG. 4. The silicon oxide film 33 will become a core insulating film. Since the workpiece has a symmetrical cross section relative to the center line C-C shown in FIG. 4, only the left part of the cross section will be described in the following descriptions. The silicon oxide film 33 will not be illustrated in the drawings after FIG. 4.

Figure 5:
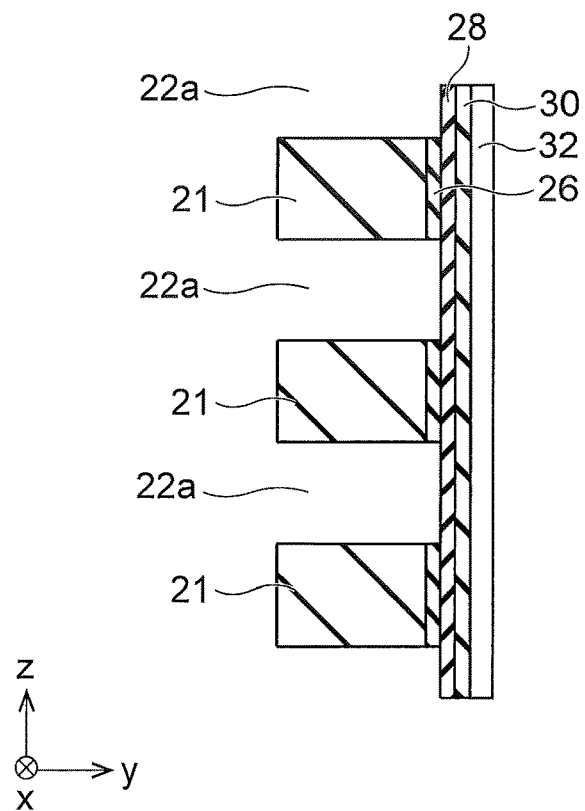

The sacrifice layers 22 are then selectively removed by wet etching to form spaces 22a by using a chemical solution (for example, phosphoric acid solution) poured from grooves (not shown) formed in the laminated body 20. The surface of the silicon oxide film 26 is exposed on the bottom of each space 22a. The exposed silicon oxide film 26 is then removed by a chemical solution such as a hydrofluoric acid solution. As a result, the silicon oxide film 26 at the bottom of each space 22a is removed, and the silicon nitride film 28 is exposed instead. The silicon oxide film 26 is left between the insulating layers 21 and the silicon nitride film 28 (FIG. 5).

Figure 6:
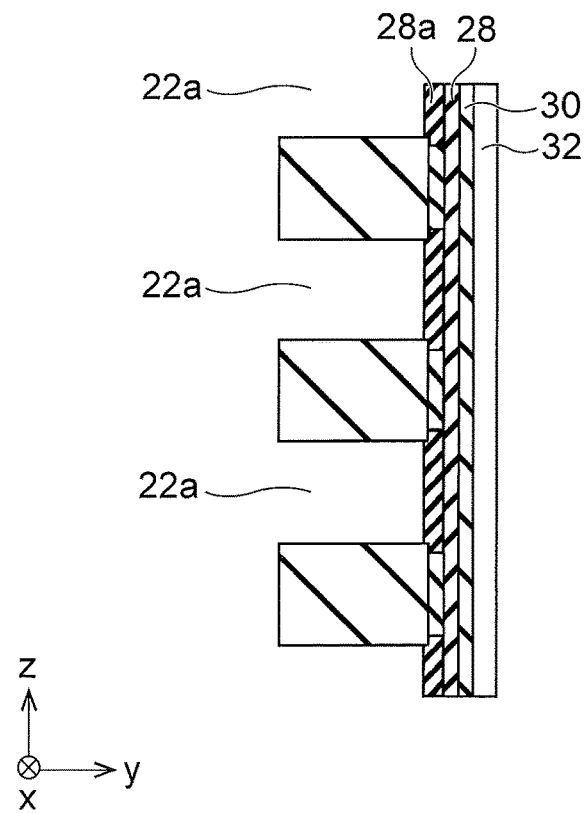

Subsequently, a silicon nitride film 28a is selectively grown from the surface of the silicon nitride film 28 exposed at the bottom of each space 22a, as shown in FIG. 6. The temperature at which the silicon nitride film 28a is grown is around 450° C., for example. Since the silicon nitride film 28a is formed at the low temperature, the silicon nitride film 28a has a larger amount of impurities and a lower density than the silicon nitride film 28.

Figure 7:
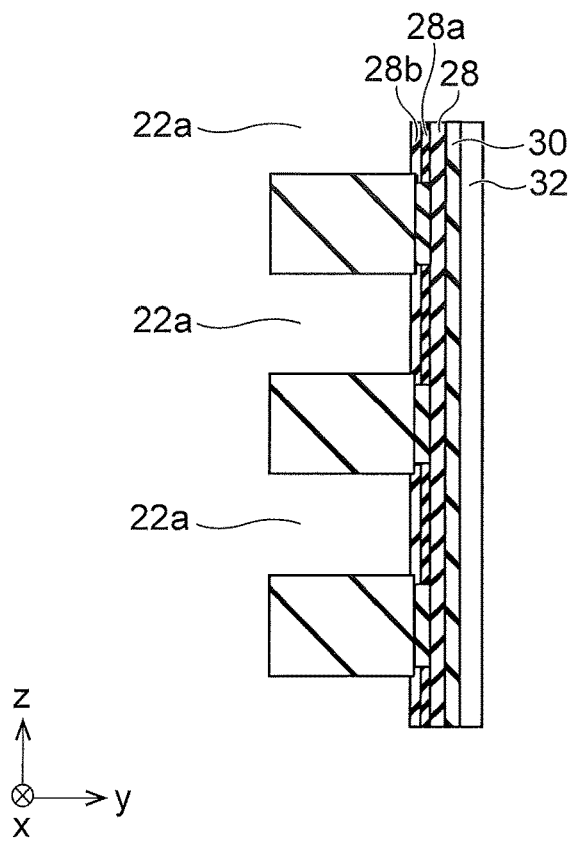

A heat treatment is performed on the silicon nitride film 28 using oxygen (O), hydrogen (H), helium (He) or a radical in which those elements are mixed, to reform a part of a surface of the silicon nitride film 28a. The heat treatment is performed in a temperature range of 600° C. to 700° C., for example. As a result, the part of the silicon nitride film 28a becomes a reformed silicon nitride film 28b (FIG. 7). As will be described later, the silicon nitride film 28b has a higher density and a lower impurity concentration than the silicon nitride film 28. In this embodiment, the part of the silicon nitride film 28a is reformed to form the silicon nitride film 28b. All of the silicon nitride film 28a may be reformed to form the silicon nitride film 28b.

Figure 8:
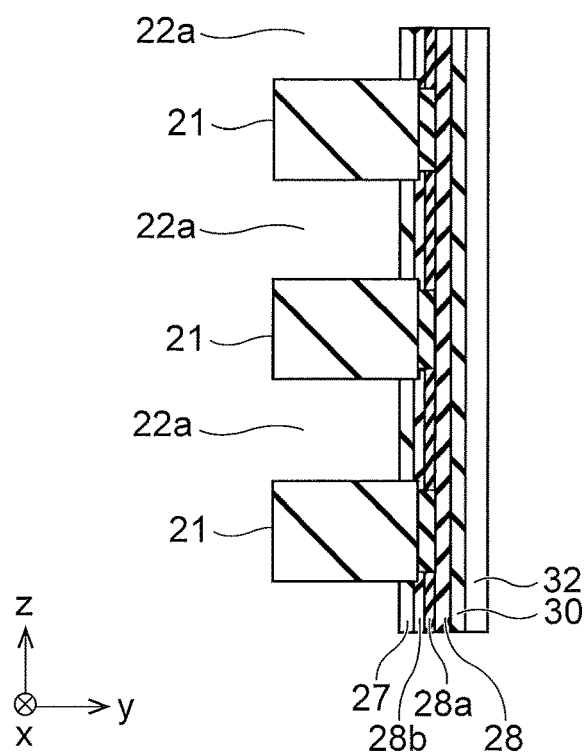
Figure 9:
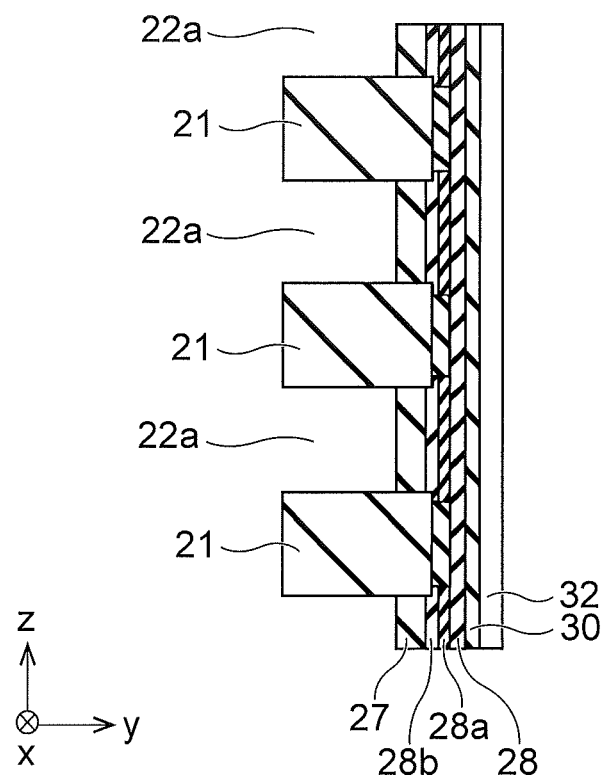

Thereafter, a silicon nitride film 27 is selectively deposited to cover the silicon nitride film 28b, as shown in FIG. 8. Subsequently, a radical oxidation treatment is performed on the silicon nitride film 27 to change the silicon nitride film 27 to a block insulating film 27a with the reformed silicon nitride film 28b being left, as shown in FIG. 9.

Figure 10A:
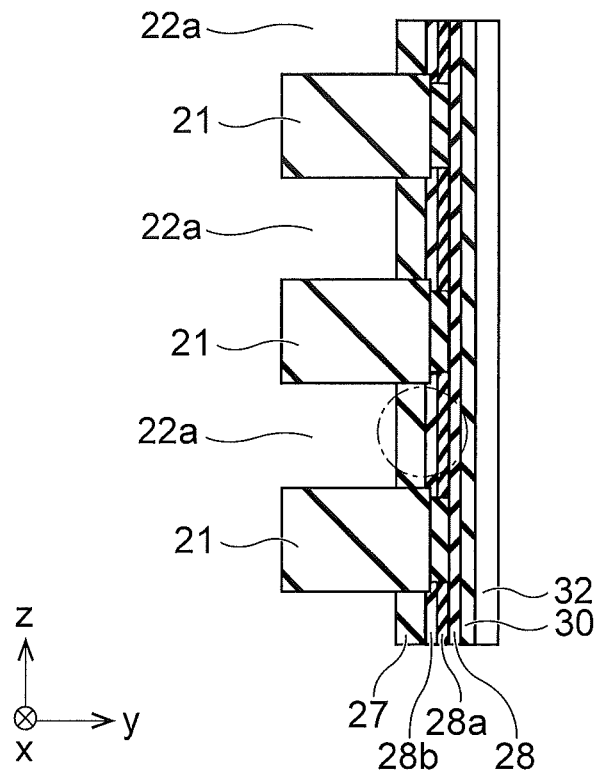
FIG. 10A and FIG. 10B are diagrams for explaining a film structure in a region corresponding to the electrode in the manufacturing step shown in FIG. 9.
Figure 10B:
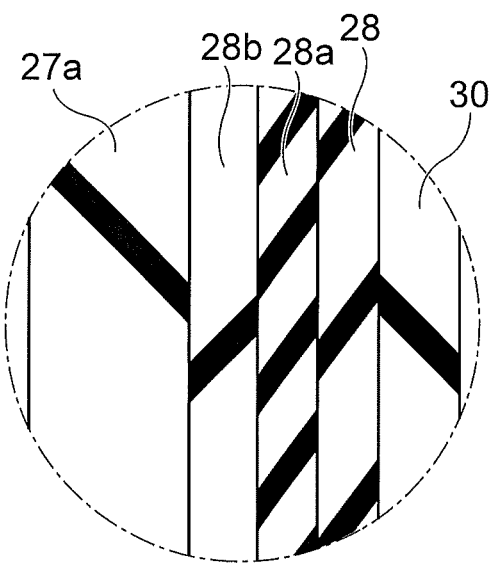

FIG. 10A shows a semiconductor storage device having a structure formed by the above-described manner. FIG. 10B is a cross-sectional view of the semiconductor storage device near the block insulating film 27a of one of the spaces 22a, circled by a dash-dotted line in FIG. 10A. The semiconductor layer 32 serves as a channel, and the silicon oxynitride film 30 serves as a tunnel insulating film 30. A charge storage film (hereinafter referred to as "CT") has a multilayer structure including the silicon nitride film 28b that is disposed on the block insulating film 27a ("BL") side and reformed, and the silicon nitride film 28 disposed on the tunnel insulating film 30 ("TNL") side.

Figure 11:
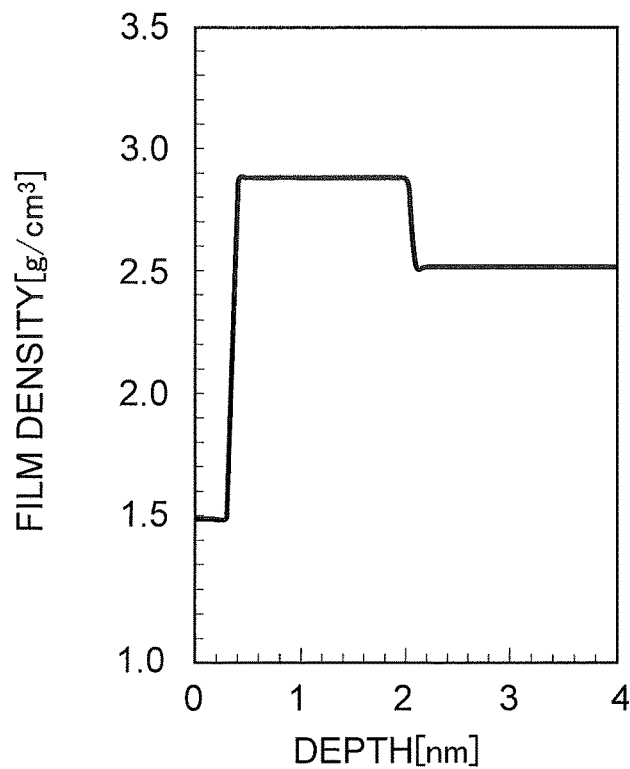
FIG. 11 is a diagram showing the profile of the film density after the silicon nitride film is reformed.
Figure 12:
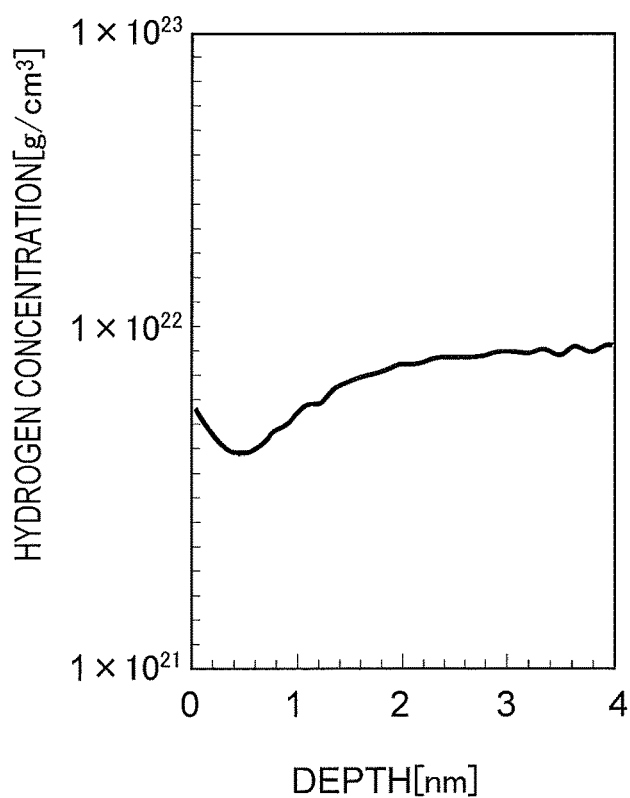
FIG. 12 is a diagram showing the profile of the impurity concentration after the silicon nitride film is reformed.
Figure 20:
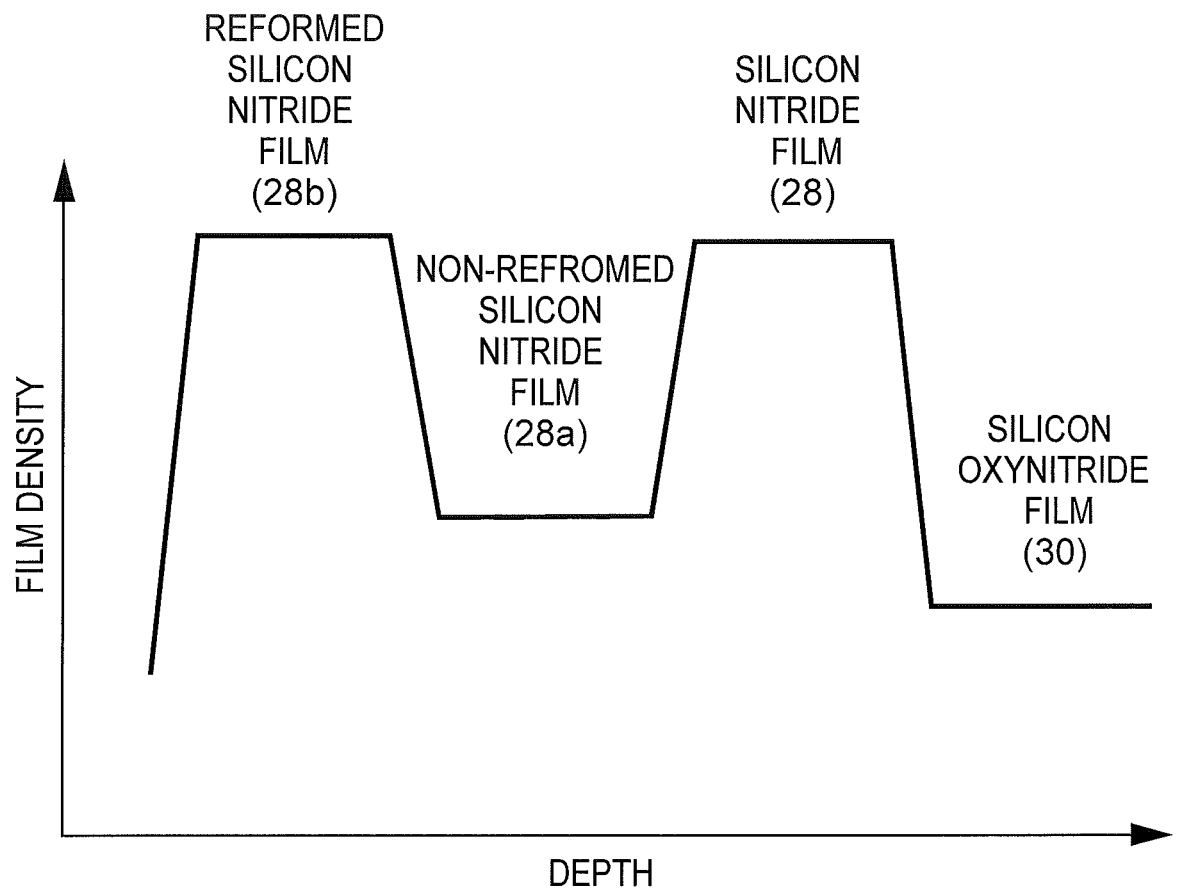
FIG. 20 is a diagram showing the profile of the film densities of a reformed silicon nitride film, a non-reformed silicon nitride film, a silicon nitride film, and a silicon oxynitride film.

FIG. 11 shows the density distribution of the silicon nitride film after the reformation, and FIG. 12 shows the impurity (for example, hydrogen (H)) distribution. As can be understood from FIG. 11, the density is 1.5 g/cm$^3$ from the film surface to the depth of 0.3 nm, 2.88 g/cm$^3$ in the depth range from 0.3 nm to 2.0 nm, and about 2.58 g/cm$^3$ when the depth is 2 nm or more. As can be understood from FIG. 11, the reformed silicon nitride film 28b has a film density of 2.88 g/cm$^3$, and the silicon nitride film 28a before reformation has a film density of 2.58 g/cm$^3$. Thus, the reformed silicon nitride film 28b has a higher film density than the silicon nitride film 28a. Furthermore, as can be understood from FIG. 12, the reformed silicon nitride film 28b has a lower impurity concentration than the silicon nitride film 28a. The impurity means one or more elements other than silicon or nitrogen. As shown in FIG. 20, a film density of the silicon nitride film 28 is equal to or more than that of the reformed silicon nitride film 28b. Similarly, an amount of impurities of the silicon nitride film 28 is equal to or lower than that of the reformed silicon nitride film 28b.

Figure 13:
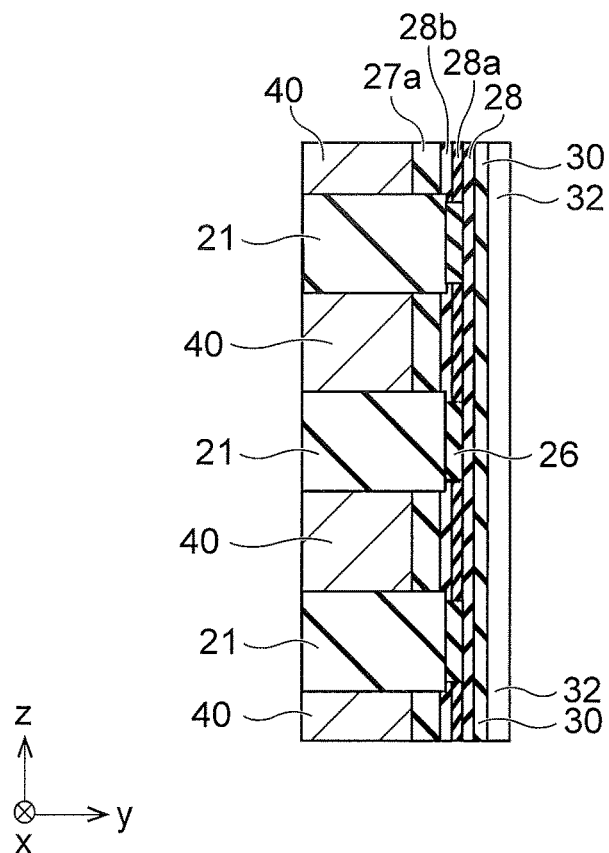
FIG. 13 is a cross-sectional view illustrating the structure of the semiconductor storage device according to the first embodiment.

Thereafter, electrode material films are filled into the spaces 22a to form electrode layers 40, as shown in FIG. 13, thereby completing the manufacture of the semiconductor storage device. The electrode layer 40 has a multilayer structure including a barrier metal layer disposed on the bottom of the space 22a (the surface of the exposed block insulating film 27a) and the side surface (the surface in contact with the insulating layer 21) of the space 22a, and a metal layer of tungsten, for example, filled to the space 22a to cover the barrier metal layer. An example of the material of the barrier metal layer is titanium nitride (TiN). A block insulating layer including an aluminum oxide (AlO) layer may be disposed between the space 22a and the barrier metal layer.

As described above, the semiconductor storage device according to the first embodiment has the structure in which the memory hole 24 is formed through the laminated body 20 including the electrode layers 40 and the insulating layers 21 that are alternately stacked in the z direction, the memory hole 24 extending in the z direction, the semiconductor layer 32 serving as the channel is disposed in the memory hole 24, the tunnel insulating film 30 including the silicon oxynitride film is disposed between the semiconductor layer 32 and the side surface (the surface along the z direction) of the memory hole 24, and the charge storage films 28 and 28b having different densities are disposed between the tunnel insulating film 30 and the side surface of the memory hole 24. The charge storage film 28b, which is the silicon nitride film 28b, has a higher density and a lower impurity concentration than the charge storage film 28, which is the silicon nitride film 28. The silicon oxide film 26 is disposed between the insulating layers 21 and the charge storage film 28, and the block insulating film 27a is disposed between the electrode layer 40 and the charge storage films 28 and 28b. The charge storage film 28 is disposed on the tunnel insulating film 30 side, and the charge storage film 28b is disposed on the block insulating film 27a side. The thickness of the charge storage films 28b and 28 between the electrode layer 40 and the tunnel insulating film 30 (for example, the thickness in the y direction) is greater than the thickness of the charge storage film 28 between the insulating layers 21 and the tunnel insulating film 30 (for example, the thickness in the y direction).

Furthermore, as described above, in the semiconductor storage device according to the first embodiment, the charge storage film has the multilayer structure including the first film 28b having a higher density and the second film 28 having a lower density. This structure may prevent the charge from moving from the charge storage film to the semiconductor layer 32 serving as the channel (in the y direction or x direction). The second film 28 continuously extends in the direction along which the semiconductor layer 32 serving as the channel extends (z direction). However, the first film 28b is divided by the insulating layers 21, and discontinuously extends in the direction (z direction) along which the semiconductor layer 32 serving as the channel extends. This may prevent the charge from moving to the direction in which the semiconductor layer serving as the channel extends (z direction). Thus, according to the first embodiment, it is possible to provide a semiconductor storage device and a method of manufacturing the semiconductor device, which are capable of preventing the degradation of the charge maintaining characteristic.

Second Embodiment

Figure 14:
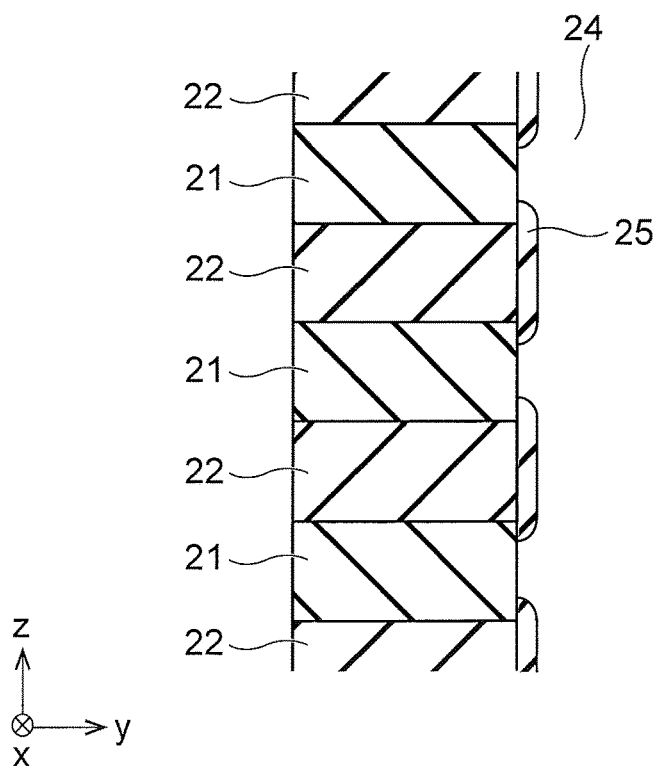
FIGS. 14 to 17 are cross-sectional views illustrating a step of a method of manufacturing a semiconductor storage device according to a second embodiment.

A semiconductor storage device according to a second embodiment will be described with reference to FIGS. 14 to 19. The semiconductor storage device according to the second embodiment is manufactured by a method described below, for example. The method is the same as the method of manufacturing the semiconductor device according to the first embodiment until a laminated body 20 is produced by alternately stacking insulating layers 21 and sacrifice layers 22 in a z direction (the vertical direction in the drawings), and a memory hole 24 is formed through the laminated body 20 in the z direction. Thereafter, silicon nitride films 25, each being a part of the sacrifice layer 22, is formed on the surfaces of the sacrifice layers 22 exposed on the side surface of the memory hole 24 by a selective growing method, as shown in FIG. 14. The "selective growing method" of the silicon nitride films 25 means a process of depositing the silicon nitride films 25 not on the insulating layers 21 but on the exposed surfaces of the sacrifice layers 22.

In this process, a gas containing halogen, such as $SiHX_3$ or $SiX_4$ (X=F, Cl, Br, or I), is caused to flow through the memory hole 24 at a low temperature such as around 450° C., so that the material of the gas is selectively deposited on the exposed surfaces of the insulating layers 21. This prevents the growth of Si precursor, such as dichlorosilane ($SiH_2Cl_2$) or hexachlorodisilane ($Si_2Cl_6$), on the exposed surfaces of the insulating layers 21. Therefore, no silicon nitride is deposited on the exposed surfaces of the insulating layers 21. The precursor is deposited only on the exposed surfaces of the sacrifice layers 22, to form the silicon nitride films 25 on the exposed surfaces.

Each of the silicon nitride films 25 formed inside the memory hole 24 by the above-described method has a thickness in the y direction of around 4 nm, for example. The silicon nitride films 25 are selectively grown in an isotropic manner. Therefore, each silicon nitride film 25 has a shape smoothly elongated in the z direction (see FIG. 14). The silicon nitride films 25 make steps on the inner surface (the surface extending in the z direction) of the memory hole 24.

Figure 15:
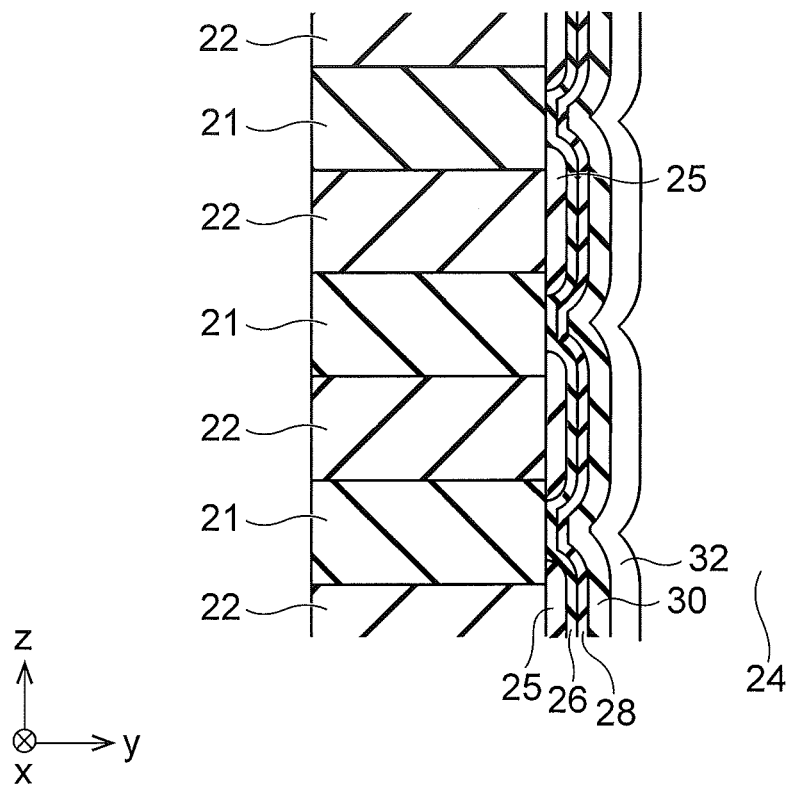

Thereafter, a silicon oxide film 26 having a thickness of 2 nm, for example, is formed on the inner surface, which has the steps, of the memory hole 24, as shown in FIG. 15. The silicon oxide film 26 will act as an etching stopper when the silicon nitride films 25 and the sacrifice layer 22 are removed in a later step.

A silicon nitride film 28 having a thickness of 2 nm, for example, is then formed to cover the silicon oxide film 26. The silicon nitride film 28 is a part of a charge storage film. Thereafter, a silicon oxynitride film 30 having a thickness of 5.5 nm, for example, which will become a tunnel insulating film, is formed to cover the silicon nitride film 28. Subsequently, a semiconductor layer 32 containing polycrystalline silicon and having a thickness of 5 nm, for example, is formed to cover the silicon oxynitride film 30 (FIG. 15). The semiconductor layer 32 will become a channel. The silicon oxide film 26, the silicon nitride film 28, the silicon oxynitride film 30, and the semiconductor layer 32 formed in the above-described manner have the shapes corresponding to the steps in the memory hole (see FIG. 15). If necessary, an opening is formed at the bottom of the memory hole 24 by means of an RIE method before the semiconductor layer 32 to serve as the channel is formed to secure the electrical connection between the channel 32 and the substrate on which the laminated body 20 is formed.

The memory hole 24 is then filled with silicon oxide, which will be a core insulating film (not shown), to complete the memory cell multilayer structure in the memory hole 24.

Thereafter, a groove is formed through the laminated body 20 around the memory hole 14, and the sacrifice layers 22 are removed through the groove. A heated phosphoric acid solution is generally used to remove the sacrifice layers 22. After the chemical solution treatment, there are spaces 22a at the locations where there were the silicon nitride layers 22. In the second embodiment, the chemical solution treatment also removes the silicon nitride films 25, and therefore each of the spaces 22a has a shape that is equivalent to the shapes of the sacrifice layer 22 and the silicon nitride film 25 (see FIG. 16).

Figure 16:
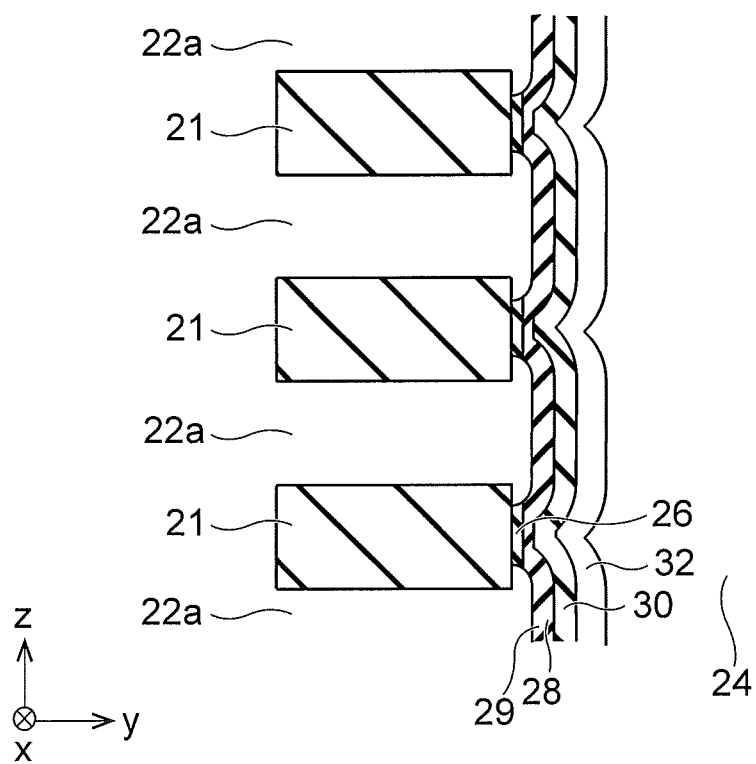

The silicon oxide film 26 at the bottom of each space 22a is then removed by means of a hydrofluoric acid (HF) solution diluted to approximately 0.5% (see FIG. 16). As a result, the silicon nitride film 28 is exposed at the bottom of each space 22a, the silicon nitride film 28 serving as a part of the charge storage film. On the other hand, the silicon oxide film 26 in the regions between the insulating layers 21 and the silicon nitride film 28 is left (FIG. 16).

A silicon nitride film 29 is then selectively grown from the exposed surface of the silicon nitride film 28. The treatment conditions are the same as those of the previously performed treatment. After the selective growth, the thickness of the silicon nitride films 28 and 29, which will become a charge storage film, is about 2.5 nm in the y direction. As the result, the thickness of the charge storage film at the bottom of the space 22a is the sum (4.5 nm) of the thickness of the silicon nitride film 28 (2 nm) and the thickness of the silicon nitride film 29 (2.5 nm). In the regions between the silicon insulating layers 21 and the tunnel insulating film 30, however, only the silicon nitride film 28 serves as the charge storage film. Therefore, the thickness of the charge storage film here is 2 nm. The silicon nitride film 28 included in the charge storage film 28, continuously extends in the direction along which the semiconductor layer 32 extends (z direction), but the silicon nitride film 29 discontinuously extends in the z direction due to the silicon oxide film 21. Thus, the charge storage film has a pseudo-separation structure.

Figure 17:
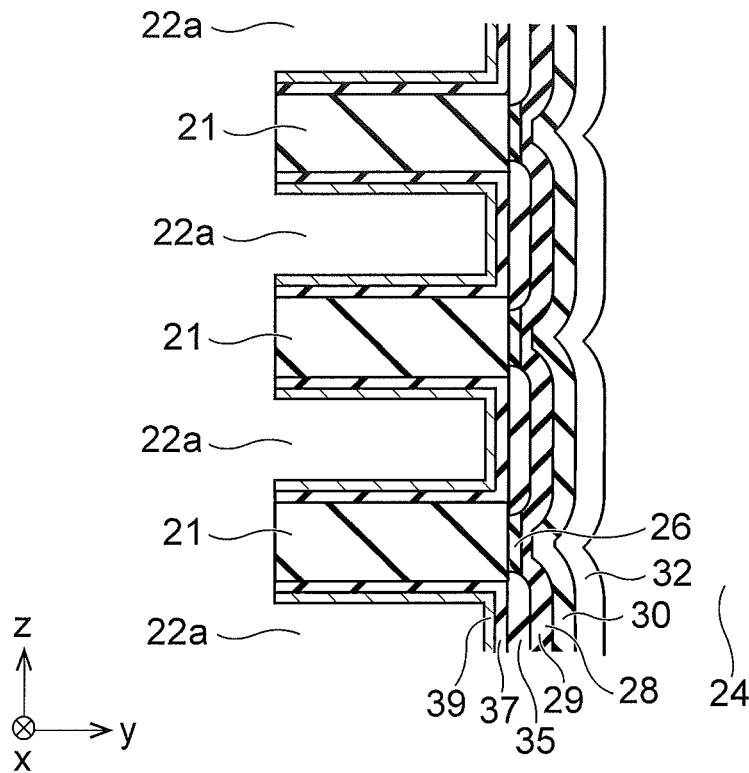

Thereafter, as shown in FIG. 17, a block insulating film 35 containing silicon oxide and having a thickness of about 6 nm is formed to cover the bottom of each space 22a. There are two methods for forming the block insulating film 35. One of the two methods is an atomic layer deposition (ALD) method using, for example, trisdimethylaminosilane (TD-MAS) and $O_3$. The other method is a radical oxidation method performed on a part of the silicon nitride film 29 using $H_2/O_2$ plasma at a temperature of 700° C. Both methods can be used. In the former, however, a silicon oxide film is also formed on the insulating layers 21. Therefore, the width (in the z direction) of the space 22a is decreased and the resistance of the wiring (word line) to be formed in the space 22a is increased. Thus, the latter is more advantageous. It should be noted, however, that when a silicon nitride is changed to a silicon oxide, the volume increases. Therefore, if the amount of oxidation of silicon nitride is considerably large, the increase in film stress may change the shape of the film. In such a case, the two methods may be combined. The block insulating film 35 is thus formed. The block insulating film 35 is retracted into the memory hole 24 in the y direction for the thickness of the silicon nitride films 25 removed to form the space 22a. Therefore, the position of the back part of the memory hole 24 is substantially the same as that of normal structures. The silicon oxide film 26 and the block insulating film 35 together comprising an insulating layer which extend along the Z direction.

Thereafter, as shown in FIG. 17, a block film 37 containing aluminum oxide, for example, is formed to cover the bottom and the side surface of each space 22a, and then a barrier metal 39 containing TiN, for example, is formed to cover the block film 37.

Figure 18:
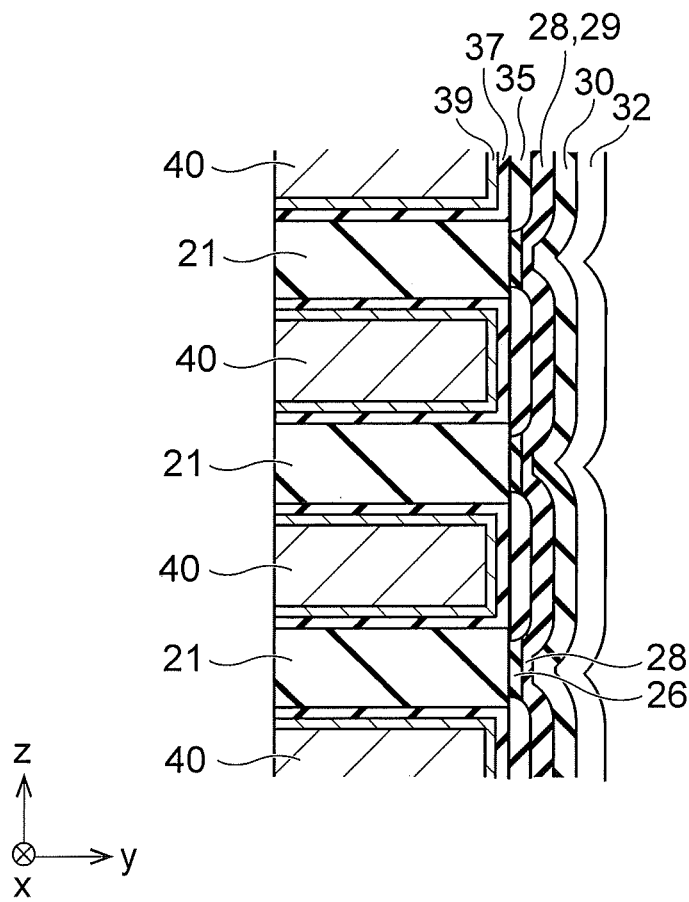
FIG. 18 is a cross-sectional view illustrating the structure of the semiconductor storage device according to the second embodiment.

Subsequently, as shown in FIG. 18, each space 22a is filled with a wiring material, for example tungsten (W), to form a word line (electrode) 40, thereby completing the semiconductor storage device.

The semiconductor storage device according to the second embodiment thus formed has the structure in which the charge storage film includes the silicon nitride film 28 and the silicon nitride film 29 in a region corresponding to the word line 40, and only includes the silicon nitride film 28 at the central portion of a region corresponding to the insulating layer 21 between adjacent word lines 40, as shown in FIG. 18. The thickness in the y direction of the charge storage film in the region corresponding to the word line 40 is greater than the thickness in the y direction in the region corresponding to the insulating layer 21. Furthermore, the thickness of the charge storage film at the central portion of the region corresponding to the insulating layer 21 is less than the thickness at the other portions of the region corresponding to the insulating layer 21. Thus, the charge storage film is thinner at the central portion of the region corresponding to the interlayer insulating layer and thicker in the portions that are closer to the electrode layer 40. As a result, the charge stored in the charge storage film is prevented from moving toward the semiconductor layer 32 serving as the channel or moving along the z direction.

The charge storage film has a shape that protrudes toward the outside of the memory hole 24 at the central portion of the region corresponding to each insulating layer 21. Thus, the charge storage film has a shape that protrudes toward the interlayer insulating film at the central portion of the region corresponding to each insulating layer 21. The tunnel insulating film 30 and the semiconductor layer 32 serving as the channel also has a shape protruding toward the outside of the memory hole 24 at the central portion of the region corresponding to each insulating layer 21. In contrast, the thickness in the y direction of the charge storage film is substantially constant in the region corresponding to each word line 40. Thus, the charge storage film has a flat shape along the z direction. Therefore, in the region corresponding to each word line 40, the tunnel insulating film 30 and the semiconductor layer 32 serving as the channel also has a flat shape along the z direction.

As a result, the distance between the central axis of the memory hole 24 and the interface between the memory hole 24 and the charge storage films 28, 29 and the tunnel insulating film 30 cyclically changes in the z direction. Thus, the interface in the region corresponding to each electrode layer 40 is closer to the central axis of the memory hole 24 than the interface in the region corresponding to each interlayer insulating layer. The distance from the central axis of the memory hole to the interface between the silicon oxide film 26 and the insulating layer 21 in the region corresponding to each interlayer insulating layer is substantially the same as the distance from the central axis to the interface between the block insulating film 35 and the block film 37 in the region corresponding to each electrode layer 40. This enables the manufacture of the semiconductor storage device without increasing the distance between memory holes. The semiconductor storage device thus manufactured has a high density that is substantially the same density as semiconductor storage devices having a structure in which the charge storage film does not have a pseudo-separation structure.

As described above, the semiconductor storage device and the method of manufacturing the semiconductor storage device according to the second embodiment are capable of preventing the degradation of the charge maintaining characteristic.

Figure 19:
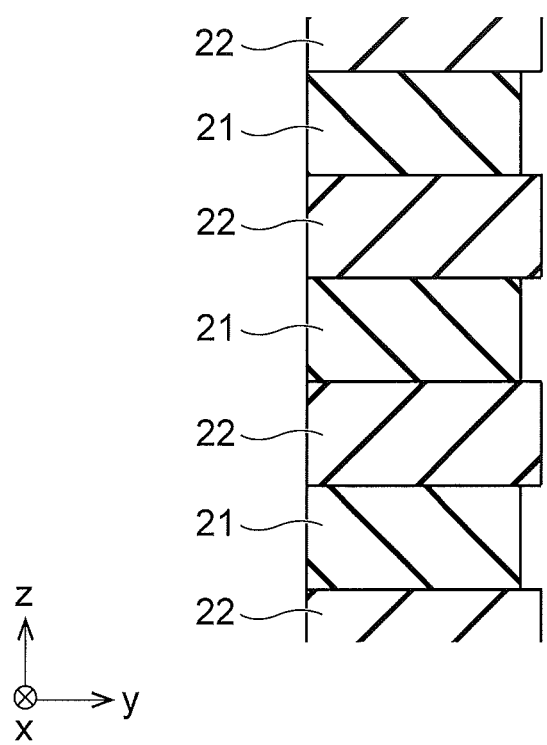
FIG. 19 is a cross-sectional view illustrating a step of a method of manufacturing a semiconductor storage device according to a modification of the second embodiment.

In the second embodiment, the silicon nitride films 25 are selectively formed on the surfaces of the silicon nitride layers 22 exposed in the memory hole 24 immediately after the memory hole 24 is formed, as shown in FIG. 14, so that protruding portions are formed along the z direction in the memory hole. However, the insulating layers 21 exposed in the memory hole may be selectively recessed to form protrusions and recessions in the memory hole 24 as shown in FIG. 19 for example, and the semiconductor storage device may thereafter be manufactured in the same manner as the second embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A semiconductor storage device comprising:
a laminated body in which electrode layers and insulating layers are alternately stacked in a first direction;
a semiconductor layer disposed along the first direction in the laminated body;
a first insulating film disposed along the first direction between the laminated body and the semiconductor layer;
a charge storage film disposed between the laminated body and the first insulating film, the charge storage film including first regions corresponding to the electrode layers and second regions corresponding to the insulating layers, thicknesses of the charge storage film in a second direction that crosses the first direction in the first regions being different from that in the second regions, the charge storage film comprising: a second insulating film disposed along the first direction between the laminated body and the first insulating film, and a third insulating film disposed between the second insulating film and the first regions, the third insulating film having a density different from that of the second insulating film; and
a fourth insulating film disposed between the electrode layer and the third insulating film, wherein an end of one of the insulating layers is between the second insulating film and the third insulating film along the second direction.
2. A semiconductor storage device, comprising:
a laminated body in which electrode layers and insulating layers are alternately stacked in a first direction;
a semiconductor layer disposed in the laminated body along the first direction;
a first insulating film disposed along the first direction between the laminated body and the semiconductor layer;

a second insulating film disposed along the first direction between the laminated body and the first insulating film; and a third insulating film disposed along the first direction between the laminated body and the second insulating film, wherein a thickness in a second direction that crosses the first direction of a region in the second insulating film, corresponding to one of the electrode layers of the laminated body, is greater than a thickness in the second direction of a region in the second insulating film, corresponding to one of the insulating layers, and a thickness in the second direction of a region in the third insulating film, corresponding to one of the electrode layers of the laminated body, is greater than a thickness in the second direction of a region in the third insulating film, corresponding to one of the insulating layers, and without the second insulating film contacting with the insulating layers.

3. The semiconductor storage device according to claim 2, wherein the second insulating film contains silicon and nitrogen.

4. The semiconductor storage device according to claim 2, wherein the third insulating film contains silicon and oxygen.

5. The semiconductor storage device according to claim 2, wherein a thickness of the second insulating film in a central portion of a region corresponding to one of the insulating layers of the laminated body is thinner than a thickness of the second insulating film in other portions of the region corresponding to one of the insulating layers.

6. The semiconductor storage device according to claim 2, wherein the second insulating film has a shape that protrudes toward the insulating layers at a central portion of a region corresponding to one of the insulating layer of the laminated body.

7. The semiconductor storage device according to claim 2, further comprising a silicon oxide film disposed between a region corresponding to one of the insulating layers of the laminated body and the third insulating film.

8. The semiconductor storage device according to claim 2, wherein an end of the laminated body in the second direction is parallel to the first direction.

* * * * *